United States Patent [19]

Seiler et al.

[11] Patent Number: 4,766,311

[45] Date of Patent: Aug. 23, 1988

[54] METHOD AND APPARATUS FOR PRECISION SEM MEASUREMENTS

[75] Inventors: Dieter G. Seiler, Carleton Place; David V. Sulway, Nepean, both of Canada

[73] Assignee: Vickers Instruments (Canada) Inc., Canada

[21] Appl. No.: 14,198

[22] Filed: Feb. 13, 1987

Related U.S. Application Data

[63] Continuation of Ser. No. 591,616, Mar. 20, 1984, abandoned.

[51] Int. Cl.[4] ...................... G01D 18/00; G01N 23/00
[52] U.S. Cl. ................................. 250/252.1; 250/307; 250/310
[58] Field of Search ............... 250/310, 311, 397, 398, 250/452.2, 442.2, 252.1, 307

[56] References Cited

U.S. PATENT DOCUMENTS 3,719,776 3/1973 Fujiyasu et al. ................. 250/442.1
4,039,829 8/1977 Kato et al. ........................ 250/310
4,052,603 10/1977 Karlson ............................. 364/120
4,221,965 9/1980 Konishi et al. ................... 250/311
4,385,317 5/1983 Furuya et al. .................... 250/310

Primary Examiner—Bruce C. Anderson
Attorney, Agent, or Firm—Cushman, Darby & Cushman

[57] ABSTRACT

A method and apparatus for making precise measurements as small as in submicron distances of an object or specimen (13) includes a stage (18) which is movable under the control of a microprocessor (20). An instrument, such as a scanning electron microscope (10) scans the object (13) to obtain a first scan representation thereof. The stage (18) is then shifted a precise known distance and a second scan is made thereof. The results of the two scans are stored and compared by the microprocessor (20) to determine the apparent magnitude of the stage shift in arbitrary units. This apparent magnitude is then equated to the known precise shift distance to calibrate the arbitrary units. The microprocessor (20) can then calculate the desired measurement from the data of either of the two scans stored therein.

8 Claims, 2 Drawing Sheets

METHOD AND APPARATUS FOR PRECISION SEM MEASUREMENTS

This is a continuation of application Ser. No. 591,616, filed Mar. 20, 1984, now abandoned.

TECHNICAL FIELD

This invention relates to a method and apparatus for making highly precise measurements of objects within the field of view of instruments altering the apparent size of such objects and, more particularly to a method and an apparatus for measuring objects in the field of view of non-optical microscopic instruments.

BACKGROUND ART

Many industries which utilize microscopic analysis rely upon highly accurate and repeatable measurements of microscopic structures. For example, in semiconductor technology measurements of structures on silicon wafers or mask designs for fabrication of integrated circuits or devices is often necessary. In response to precise measurement needs, various direct measurement techniques utilizing both optical and electron beam scanning devices have been developed. However, due to factors inherent in such systems, these approaches become subject to increasing measurement error as the size of the object being studied decreases. Since projected technological advances, particularly in the semiconductor industry, are expected to lead to even further reduced geometries, alternative techniques are necessary to correct deficiencies found in the known art.

Possibly the most familiar among direct measurement approaches known to the art are optical techniques which employ a laser beam, or other monochromatic ray shaped by a mechanical slit, either of which are scanned across the subject structure in discrete, known steps. The number of sequential steps taken during the scan is simply counted and, for example, when applied in the semiconductor industry, a linewidth can thereby be calculated. Recent improvements to optical systems have provided an increased capability to control measurements. Computers may conform the mechanical slit to the basic shape of the subject structure and then position the slit directly over it resulting in an increase in accuracy. Also, video displays may be used to provide an image on a cathode ray tube (CRT) which is divided into areas of known dimension. Such areas may be counted either manually at the CRT or automatically by computer. Despite these improvements, resolution capabilities ultimately limit all optical systems to geometries no smaller than about 0.4–0.5 micrometers.

To make measurements of linewidths in the half micrometer category and below, scanning electron microscope (SEM) approaches are necessary. SEM systems known to the art operate by scanning a low energy (1–2 keV) electron beam across the structure mounted on a stage. Backscattered electrons and secondary electrons resulting from the physical interaction between the electron beam and the subject structure are sensed by a detector so that signals having a waveform characteristic of the measurement subject may be generated. The signal data is digitized and processed as a video signal to produce an image on a video display screen. A conventional method of SEM linewidth measurement then entails measuring the distance of a reference object whose distance is known and comparing that measurement data with data obtained through performing an identical routine with the subject of interest. Dimensions of the subject are thereby estimates relative to the dimensions of the reference object.

The SEM linewidth measurement method as disclosed in U.S. Pat. No. 4,221,965, also allows correction for tilting of the semiconductor wafer, including the linewidth to be measured, an unknown angle $\theta$ with respect to the image plane. In that method, two cursors that define the distance of measurement interest are manually aligned with two wafer marks of interest, and a distance measuring circuit or computer then calculates (using simple geometric relationships) the actual distance between the wafer marks (the unknown linewidth) based on those cursor positions, the azimuthal angle $\Delta\theta$, and a preset magnification factor.

All of these prior art SEM methods are characterized by their heavy dependency on careful adjustment and monitoring of several parameters influencing magnification. These parameters include the SEM acceleration voltage, focusing coil excitation, and working distance. Typically calibration before each measurement may be necessary due to insufficient monitoring and control of the acceleration voltage or focusing coil excitation. The exact working distance may never be precisely known. Moreover, the prior methods are further subject to error introduced by operator misjudgments regarding focus of either the reference or subject objects and error attributed to misjudgment of distance or alignment on visual displays.

Thus, in order to eliminate the dependence of linewidth measurement techniques on magnification and human factors introducing inaccuracy and nonrepeatability, an improved method and compatible apparatus is disclosed.

DISCLOSURE OF THE INVENTION

It is a primary object of the present invention to provide a method and apparatus which allows precise and accurate measurements of objects of small dimensions.

It is another object of the present invention to provide a method and apparatus, as above, which allows precise and accurate measurements using an electron device irrespective of substantial changes in magnification due to acceleration voltage uncertainty, scan system drift and imprecise knowledge of working distance.

It is another object of the present invention to provide a method and apparatus, as above, in which an instrument for performing a linewidth measurement is calibrated at the same time that a measurement is carried out, using a calibration procedure independent of unreliable magnification parameters.

It is a further object of the present invention to provide a method and apparatus, as above, capable of providing accurate and repeatable measurements within a range of approximately 0.1 micrometers to at least 100 micrometers.

It is yet another object of the present invention to provide a method and apparatus, as above, which improves accuracy of measurement systems which utilize scanning electron microscopes or other imaging devices.

It is still another object of the present invention to provide a method and apparatus, as above, which is substantially insensitive to human error in video cursor alignment.

These and other objects and advantages of the present invention over existing prior art forms will become more apparent and fully understood from the following description in conjunction with the accompanying drawings.

In general, the method and apparatus of the present invention includes a movable stage which carries the object or specimen to be measured. An instrument, such as an SEM, is used to obtain a first scan representation of the object. The stage is then displaced a known distance along a known reference direction resulting in a displacement of the object in the direction of the distance to be measured. Then the instrument is used to obtain a second scan representation. Both the first and second scan representations are stored by a processor means which compares the representations to determine the apparent magnitude of the displacement of the object in arbitrary units. The apparent magnitude of the displacement is then equated with the known stage displacement to determine the distance represented by arbitrary units. The processor means can then use either the first or second scan representation to calculate the precise measurement of any portion of the object.

BRIEF DESCRIPTION OF THE DRAWINGS

FIG. 3a is a representation of a typical signal to the video display which creates the image appearing in FIG. 2a.

PREFERRED EMBODIMENT OF THE INVENTION

Figure 1:
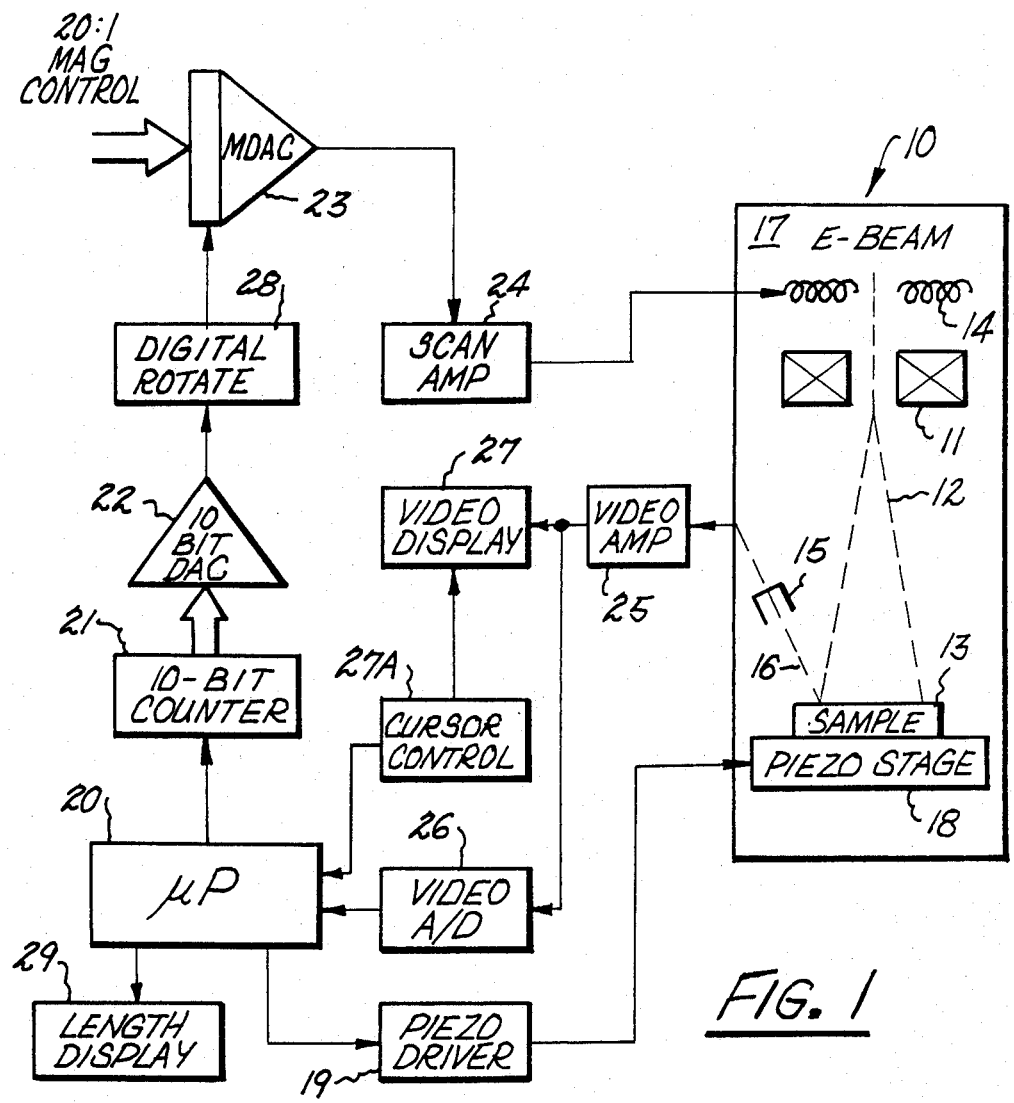
FIG. 1 is a block diagram of a system for measuring objects according to the concept of the present invention.

FIG. 1 shows, in block schematic form, an apparatus embodying the concepts of the present invention. Though the description of the preferred embodiment will only be directed to an X-axis scan, it would be appreciated by one skilled in the art that the actual device used may have identical capabilities for performing Y-axis and Z-axis scans.

A conventional SEM is generally indicated by the numeral 10. SEM 10 includes a focusing coil or lens 11 which focuses the emitted electron beam probe 12, the electron beam being directed toward sample 13. Sample 13 may be any material suitable for scanning electron microscopy examination, such as a semiconductor silicon wafer. Scan coils 14 control the deflection of the electron beam 12 such that the beam scans across the surface of sample 13 along a direction determined by the excitation of scan coils 14. An electron detector 15 collects the backscattered and/or secondary electrons 16 emitted from the sample when the electron beam 12 impinges on the sample. These primary elements of SEM 10 are all wholly contained within a vacuum chamber 17 suitable to allow formation of an electron probe.

Sample 13 is mounted on a stage 18. Stage 18 may be any conventional device, such as the piezoelectrically driven stage shown in FIG. 1, which provides precise movement over distances as short as 1 micrometer or less, or as long as 10 micrometers. Stage 18 is operated by a conventional piezoelectric driver circuit 19 upon receipt of a digital signal representative of the desired travel distance from a conventional microprocessor 20 programmable by one of ordinary skill in the art.

Figure 4:
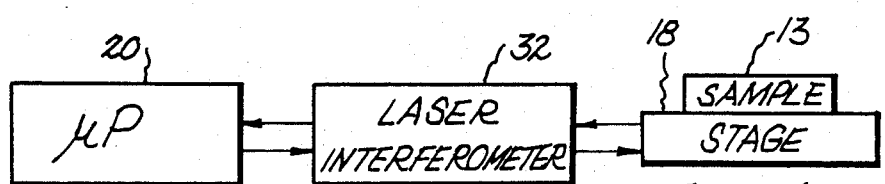
FIG. 4 is a partial block diagram of a system for measuring objects in which an interferometer is utilized with a conventional mechanical stage to displace the sample a precisely measured distance.

It will be appreciated that since the accuracy of the method described herein is ultimately dependent upon the precision with which is known the travel distance of stage 18, it is greatly desirable and may be essential in determining this distance to employ an additional stage-shift calibration. One such stage-shift calibration may simply involve the independent measurement of travel distance by a highly precise optical means such as the laser interferometer 32 shown in FIG. 4. Alternately, a diffraction grating replica may be utilized in the manner explained hereinbelow.

In addition to providing digital control signals for movement of the stage 18, microprocessor 20 provides control of the electron beam, acquisition and storage of the video signal, and processing of the video signal to calculate dimensional parameters of sample 13.

In controlling electron beam scan, microprocessor 20 clocks a counter 21 whose digital counter signal output is received by a digital-to-analog (hereinafter called "D/A") converter 22 compatible in bit size with counter 21, which transforms the digital counter signal into a linear analog scan signal that determines the scan pattern of the electron beam. After alignment correction noted below, the scan signal is attenuated by a 12-bit multiplying D/A converter 23 to provide for continuous magnification control. Such control, in the preferred form, is adjustably variable up to a factor of 20 to 1. The attenuated scan signal is amplified by scan amplifier 24 and then applied to scan coils 14. Scan coils 14 respond to the scan signal to generate a straight line scan by the electron beam. Combined with scan amplifier 24, the magnification control unit produces a range of line scans from 20 micrometers ($\times 5,000$) down to 1.00 micrometer ($\times 100,000$). Counter 21 can be a conventional 10-bit counter, in which instance 1024 discreet pixels would comprise each line scan. It will be apparent to the skilled artisan that the microprocessor clock rate signal used to clock counter 21 will determine the pixel dwell time and thus the amount of time used to generate a single line scan. A pixel dwell time of 50 microseconds will result in approximately a 50 millisecond line scan time.

Often the direction of line scan is not aligned with the axis of travel of stage 18, called the X-axis of stage 18. A digital rotate circuit 28, interposed between D/A converter 22 and multiplying D/A converter 23, provides a +90 degree rotation of the electron beam scan as observed from the field of view shown by a display 27. Electron detector 15 generates an analog video signal of each line scan by methods well known to one skilled in the art. This video signal is amplified by a conventional video amplifier 25 and then digitized by an 8-bit analog-to-digital (hereinafter called "A/D") converter 26. Also, the video image signal is received by display 27 and by conventional methods provides a visual image of the line scan. In order to enable the operator to identify the area of sample 13 to be measured, display 27 should include at least one, but preferably two potentiometers or other controls 27A for manually positioning a cursor at the boundary of interest.

Microprocessor 20 initiates each line scan by directly clocking counter 21, as previously described. After each clock pulse output, the microprocessor inputs, after a predetermined delay, the corresponding 8-bit video signal from A/D converter 26 and sequentially stores this value in a memory address which directly represents the horizontal distance (in pixels) along the line scan. The delay is desirable to allow sufficient pixel dwell time to generate a stable signal from electron detector 15. It will be apparent to one skilled in the art that each of the 1024 memory addresses corresponds to a particular pixel location along the line scan.

The remaining features and elements of the invention can best be described by an explanation of a typical calibration and measurement process, such as a linewidth measurement on a semiconductor wafer.

Simply stated, the method herein disclosed involves correlating a precisely known stage 18 travel distance to the observed video shift to determine what shall be called the calibration factor. The calibration factor yields a precise knowledge of instrument magnification, which in turn permits precise distance measurements between points on objects on stage 18 by measurement of their observed video separation, followed by a simple algebraic calculation.

Initially it is desirable, and for some types of stages 18 may be essential, to independently verify that the distance traveled by stage 18 is precisely known. In the present example, where a piezoelectrically-driven stage is utilized, a diffraction grating replica (hereinafter called the "grating") may be utilized. In this instance the grating is placed on stage 18 and the two cursors aligned by the operator to coincide with two grating lines at least two grating periods apart. The actual separation between these two periods may be entered into microprocessor 20 by the operator via keyboard. Microprocessor 20 determines the video separation (in pixels) between the periods defined by the cursors by the use of correlation techniques. Grating edge roughness is accounted for by averaging several measurements along the grating lines. Microprocessor 20 next determines a scale calibration factor by equating the video separation (in pixels) with the actual separation (in micrometers). Several nominal 1 micrometer stage shifts are then actuated by microprocessor 20 and the average apparent video shift (in pixels) is calculated. The scale calibration factor is applied to the video shift distance to yield a stage shift calibration factor in micrometers which is used for all subsequent measurements. Where desired, additional stage-shift calibrations may be done for stage shifts of other lengths.

After calibration is complete, the grating is removed from stage 18 and sample 13, which may be any semiconductor wafer which has been processed to the point of including circuit lines, photoresist lines, or oxide lines, is placed thereon. SEM 10 is energized and the desired area to be scanned is located in the field of view on display 27, by methods well known to the skilled electron microscopist.

Figure 2A:
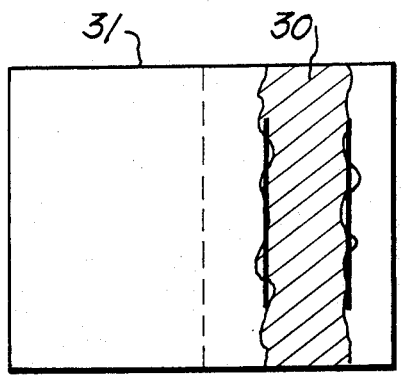
FIG. 2a is a representation of the field of view as would be shown on a video display utilized in the present invention prior to the measurement of the object.

A typical raster image 31 of the field of view is presented on display 27 and can be seen in FIG. 2. The specific linewidth 30 to be measured is shown as being in the right half of the raster 31 in FIG. 2a. The magnification control provided by D/A converter 23 is preferably used to maximize the area of the linewidth in the right half of the raster in order to maximize resolution.

The digital scan rotate circuit 28 can be used to orient the linewidth as in FIG. 2a such that the electron beam horizontal line scan will be orthogonal to the linewidth in this example. Cursor control 27A is adjusted by the operator to align a cursor over the point in linewidth 30 at which the line scan is to be taken.

Microprocessor 20 then initiates the line scan as previously described. When the first line scan is made, 1024 digitized video samples from A/D converter 26 are stored by the microprocessor in a temporary memory. Nine more line scans are made and each time 1024 video signals are added into the temporary memory. When 10 scans are completed each of the 1024 memory addresses in the temporary memory contains 10 readings summed together. Each value in the temporary memory is then divided by 10 to obtain an average video signal, a conventional video signal processing technique to reduce noise. The 1024 average values are then sequentially loaded by the microprocessor into a video memory.

Figure 2B:
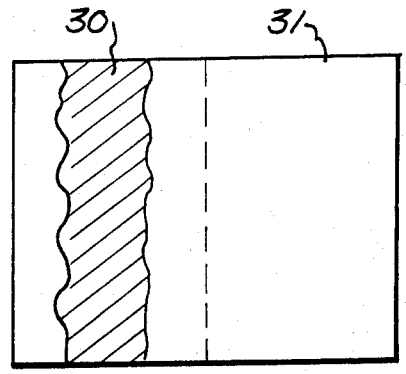
FIG. 2b is a representation of the field of view as would be shown on a video display utilized in the present invention midway through the measurement of the object.

When the initial scan (the ten scan average) is completed microprocessor 20 produces a digital signal to piezo driver 19 to cause stage 18 to shift. The shift must be such that the linewidth being measured remains within the raster 31 as shown in FIG. 2b. In the example being described, for a magnification range of ×5000 up to 10,000 the stage shift is nominally 4 micrometers; for a magnification range of 10,000 up to 20,000 the stage shift is nominally 2 micrometers; for a magnification range of 20,000 up to 40,000 the stage shift is nominally 1 micrometer; and for a magnification range of 40,000 up to 100,000 the stage shift is nominally 0.5 micrometer.

Figure 3A:
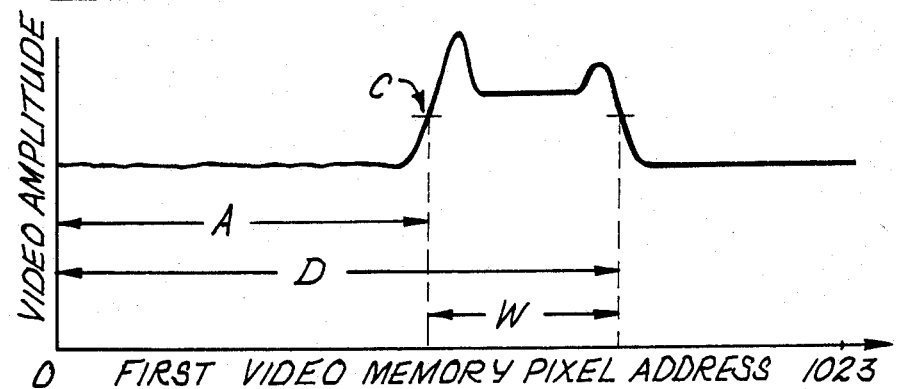
Figure 3B:
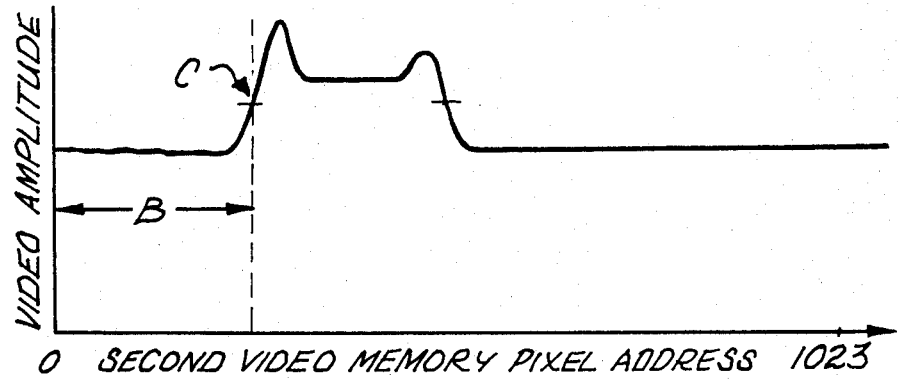
FIG. 3b is a representation of a typical signal to the video display which creates the image appearing in FIG. 2b.

After the stage has moved, microprocessor 20 initiates the second set of 10 line scans. The 1024 averaged video samples are generated as previously described and are stored in a second video memory in microprocessor 20. An analysis is then performed by microprocessor 20 on the data in the two video memories in order to determine the apparent video line shift. FIGS. 3a and 3b illustrate typical video signals which would be stored before and after the shift of stage 18, respectively. The apparent video line shift may be determined by conventional threshold techniques where the contents of the video memories are searched for a preselected trigger amplitude C, and the apparent line shift is found by taking the difference between the video memory locations A and B containing this trigger amplitude. We have found that by correlating the video signals in video memories, the apparent video line shift can be determined substantially independent of deleterious processing factors.

This preferred autocorrelation technique involves comparing at least a portion of the first video memory (which will be called the "window") containing at least one edge of the linewidth being measured in its pre-shift position with a window of comparable width in the second video memory containing the post-shaft video image of the same linewidth edge. The comparison is incremented pixel by pixel until the difference between video amplitude data stored in the two video memories is at a minimum, whereupon the two profiles will have been correlated and the distance (in pixels) between the two comparison windows equals the apparent video line shift. It will be appreciated that since each video amplitude is digitally represented by a byte of preselected bit length, the differences examined are most readily determined from the sum of the magnitude of the differences for each corresponding bit pair in the two windows. At this point the actual distance moved by the piezo stage is known in micrometers from the calibration procedure, and the apparent video line shift has been found by autocorrelation. A calibration factor in micrometers per pixel is then calculated by dividing the piezo stage distance moved, by the video line shift distance. Thus, by correlating a precisely known change in distance provided by a shift in the piezo stage with the apparent video image shift, a precise calibration of the SEM image is obtained, independent of working distance, magnification and like parameters which heretofore made calibration of the SEM image unreliable.

Once the calibration factor has been determined, the linewidth measurement is next calculated. The data in either the first or second video memory or a combination thereof can be analyzed to determine the linewidth. In this example, analysis of data in the first memory will be described. Referring again to FIG. 3a, the linewidth W is the mathematical difference between distance D and distance A. These distances may be determined by first selecting a suitable trigger value which could again but need not be point C. Where different structures on sample 13 are to be measured the selected trigger level can be adjusted so as to take into consideration inherent profile differences between different structures which may be examined. Such trigger levels may be based on theoretical approximations of the structure profile under measurement. The values between the cursor boundaries stored in the first memory are then sequentially scanned from a first cursor boundary toward the second cursor boundary until the first memory address is located which has a video signal value equal to or greater than the trigger value. Next, the values between the cursor boundaries stored in the first memory are sequentially scanned from the second cursor boundary toward the first cursor boundary until the memory address is located which contains a video signal value equal to or greater than the trigger value. The memory addresses so determined represent distance A and distance D in pixels. Linewidth W can then be calculated as the difference between distance A and distance D in pixels. The resulting difference is then multiplied by the calibration factor which is in units of micrometers/pixel, to result in a linewidth W in units of micrometers. A signal representative of length W can be transmitted by microprocessor 20 and received by a length display 29 which may be a conventional printer or CRT.

Although it is not at all critical to the operation of the present invention, it should be pointed out that another pre-measurement calibration routine may be desirable. This provides calibration of the SEM magnification at a particular working distance and voltage setting, for example, to yield an estimate of the stage shift distance in pixel units.

The magnification calibration routine, when performed can, for instance, greatly reduce processing time, since a majority of the video buffer memory would not have to be searched in order to locate a shifted edge profile. The SEM system magnification factor determines the appropriate stage shift distance such that the chosen shift is within the field of view. The image shift distance in pixel units becomes the calibrated shift (CSHIFT) at the given magnification when the routine is performed (CALMAG). Any changes in magnification should track the calibrated shift and therefore the estimated image shift distance in pixels at any magnification will be:

$$\text{Estimated Image Shift} = \frac{(\text{MAG})(\text{CSHIFT})}{\text{CALMAG}} \text{ (in units of pixels)}$$

where
CALMAG is the magnification used when the magnification calibration routine was performed;
CSHIFT is the image shift distance in pixel units as measured during the magnification calibration routine; and,
MAG is the current magnification programming value for the scan.

Thus for any given magnification, the estimated shift distance in pixels can be supplied to the processor to facilitate its search of the second video memory.

Several possible modifications to the apparatus described herein would occur to one of ordinary skill in the art. In addition to measurements in the X and Y plane, height measurements could be made in the Z-axis by developing a stage suitable for accurate elevational shifts. Also, memory capacity could be increased allowing for higher resolution and larger measurement areas.

Inasmuch as the present invention is subject to many variations, modifications, and changes in details, a number of which have been expressly stated herein, it is intended that all matter described throughout this entire specification or shown in the accompanying drawings be interpreted as illustrative and not in a limiting sense. It should thus be evident that a device constructed according to the concept of the present invention, and reasonably equivalent thereto, will accomplish the objects of the present invention.

What is claimed is:

1. A method for making calibrated distance measurements of a structural feature on an object represented by an SEM image in terms of predetermined absolute distance units, said method comprising the steps of:
   generating a first SEM representation of at least a portion of said object;
   displacing said object through a known absolute distance $\Delta d$ along a predetermined direction in terms of predetermined units of distance measure;
   generating a second SEM representation of at least said portion of the object;
   comparing said first and second SEM representations to determine the apparent displacement therebetween $\Delta d'$ in terms of arbitrary distance measurement units;
   generating a calibration factor $\Delta d / \Delta d'$;
   measuring an apparent dimension $D_x$ of said structural feature within an SEM image in terms of said arbitrary distance measurement units; and
   determining the calibrated absolute dimension $D_c = D_x \Delta d / \Delta d'$ of said structural feature in terms of said predetermined units of distance measure.

2. A method as in claim 1 wherein said comparing step comprises:
   successively shifting said first and second SEM representations relative to one another in terms of said arbitrary distance measurement units and autocorrelating the two representations at each of plural of the thus shifted positions to detect the relative such shifted distance at which a maximum autocorrelation is achieved and thus the apparent displacement $\Delta d'$.

3. A method as in claim 1 wherein each of said generating steps comprises averaging together a plurality of SEM line image data.

4. A method as in claim 2 wherein each of said generating steps comprises averaging together a plurality of SEM line image data.

5. Apparatus for making calibrated distance measurements of a structural feature on an object represented by an SEM image in terms of predetermined absolute distance units, said apparatus comprising:

means for generating a first SEM representation of at least a portion of said object;

means for displacing said object through a known absolute distance $\Delta d$ along a predetermined direction in terms of predetermined units of distance measure;

means for generating a second SEM representation of at least said portion of the object;

means for comparing said first and second SEM representations to determine the apparent displacement therebetween $\Delta d'$ in terms of arbitrary distance measurement units;

means for generating a calibration factor $\Delta d/\Delta d'$;

means for measuring an apparent dimension $D_x$ of said structural feature within an SEM image in terms of said arbitrary distance measurement units; and means for determining the calibrated absolute dimension $D_c = D_x \cdot \Delta d/\Delta d'$ of said structural feature in terms of said predetermined units of distance measure.

6. Apparatus as in claim 5 wherein said comparing step comprises:

means for successively shifting said first and second SEM representation relative to one another in terms of said arbitrary distance measurement units and autocorrelating the two representations at each of plural of the thus shifted positions to detect the relative such shifted distance at which a maximum autocorrelation is achieved and thus the apparent displacement $\Delta d$.

7. Apparatus as in claim 5 wherein each of said means for generating comprises means for averaging together a plurality of SEM line image data.

8. Apparatus as in claim 6 wherein each of said means for generating comprises means for averaging together a plurality of SEM line image data.

* * * * *